May 1, 1962 L. HARRIS 3,032,716

LOGARITHMIC OUTPUT INTERMEDIATE FREQUENCY AMPLIFIER

Filed Jan. 28, 1950 2 Sheets-Sheet 1

INVENTOR.
LAWRENCE HARRIS

BY Henry L. Shenier

ATTORNEY

LOGARITHMIC OUTPUT INTERMEDIATE FREQUENCY AMPLIFIER

Filed Jan. 28, 1950 2 Sheets-Sheet 2

INVENTOR.
LAWRENCE HARRIS
BY Henry L. Shenier
ATTORNEY

United States Patent Office 3,032,716
Patented May 1, 1962

3,032,716

LOGARITHMIC OUTPUT INTERMEDIATE FREQUENCY AMPLIFIER

Lawrence Harris, Brooklyn, N.Y., assignor, by mesne assignments, to United Aircraft Corporation, East Hartford, Conn., a corporation of Delaware Filed Jan. 28, 1950, Ser. No. 141,009
7 Claims. (Cl. 328—145)

My invention relates to logarithmic output intermediate frequency amplifiers, and more particularly to an intermediate frequency amplifier for radar receivers characterized by an output signal which is proportional to the logarithm of the input signal, and in which there exists instantaneous automatic gain control as an inherent function in its mode of operation.

In the intermediate frequency amplifiers of the prior art in which there was a logarithmic characteristic, it has been necessary to use an external video amplifier in order to achieve an instantaneous automatic gain control.

One object of my invention is to provide a logarithmic output intermediate frequency amplifier having an instantaneous automatic gain control without the necessity of the use of additional thermionic tubes.

Another object of my invention is to provide a logarithmic output intermediate freqnuency amplifier having improved circuit.

Other and further objects of my invention will appear from the following description.

In the accompanying drawings which form part of the instant specification and which are to be read in conjunction therewith:

Figure 1:
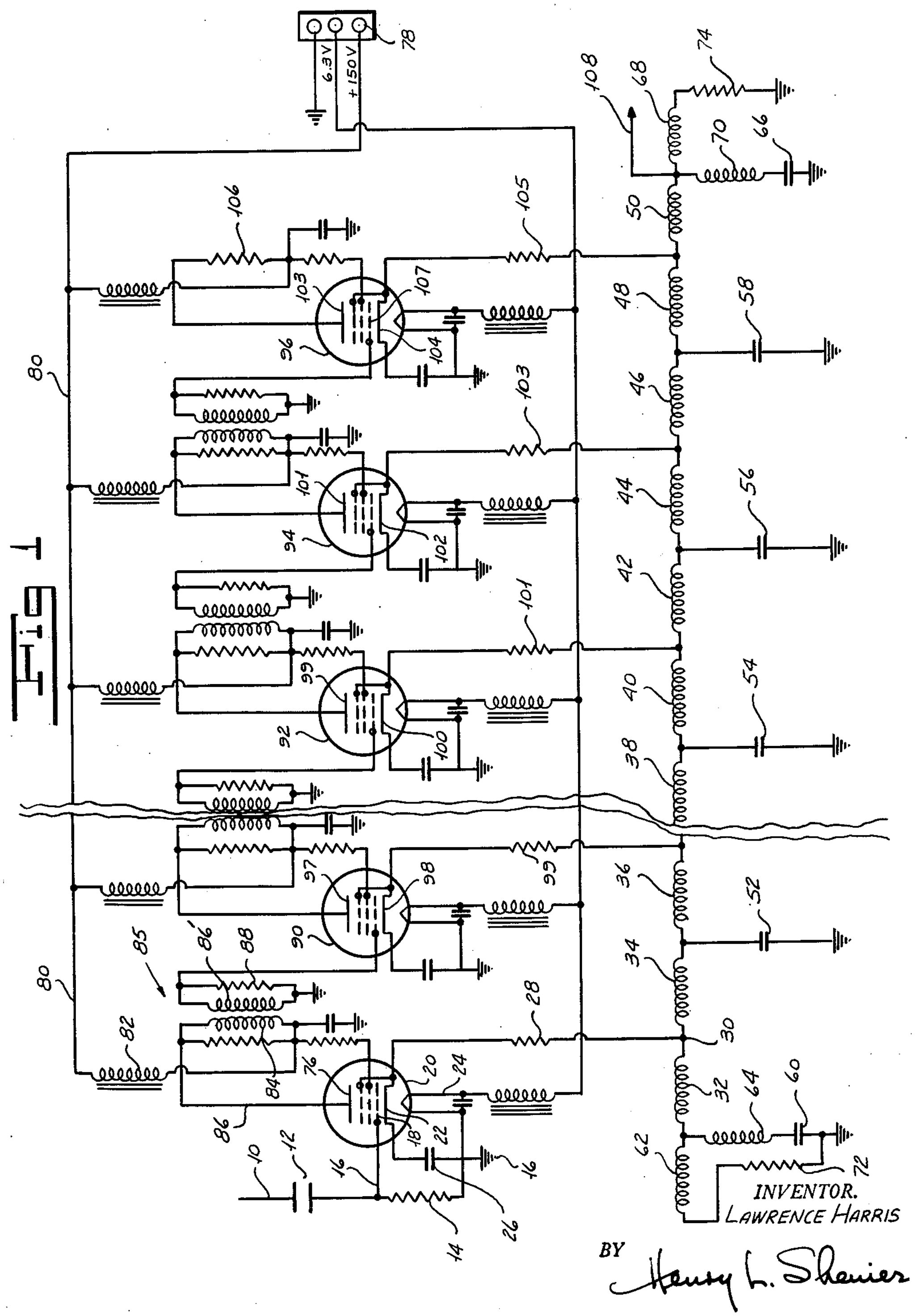
FIGURE 1 is a diagrammatic view showing the circuit of an intermediate frequency amplifier containing one embodiment of my invention.

Referring now to FIGURE 1, an input signal is impressed through conductor 10 across coupling capacitor 12 across grid resistor 14 to ground 16. The signal across the grid resistor 14 is led by conductor 16 to the control grid 18 of a thermionic tube 20, having a cathode 22 heated by a heater 24. The cathode 22 is connected to ground 16 through a by-pass capacitor 26 of such value that the carrier signal is by-passed to ground, but in conjunction with resistor 28 and the equivalent resistance of the filter, as appearing at point 30 which is the junction of inductor 32, inductor 34 and the resistor 28, has a time constant much less than the rise time of the signal.

Figure 2:
FIGURE 2 is a curve of voltage plotted against time showing a pulsed radio frequency signal.
Figure 3:
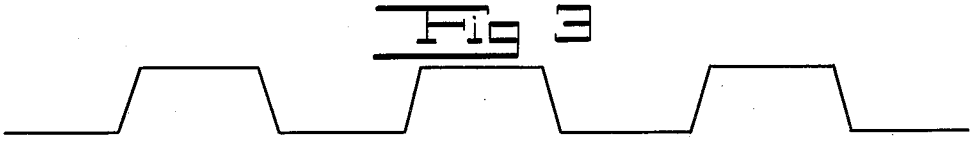
FIGURE 3 is a curve of voltage plotted against time showing a rectified signal of the pulsed radio frequency signal shown in FIGURE 2.

The inductors 32, 34, 36, 38, 40, 42, 44, 46, 48 and 50 are the series inductance elements in a low pass filter having a cut-off frequency $f_c$ determined by the characteristics of the signal such as pulse length, pulse rise time, percentage of permissible overshoot and percentage of permissible undershoot. Typical pulsed radio frequency signal is shown in FIGURE 2. The capacitors 52, 54, 56 and 58, together with the inductors 34, 36, 38, 40, 42, 44, 46 and 48, form a prototype version of the low pass filter while capacitor 60 and inductors 62, 64 and 32 form a terminating m-derived section of the filter. The capacitor 66 and the inductors 68, 70 and 50 form a similar terminated m-derived section. The resistor 72, together with the resistor 74, or a similar resistive load such as a terminated matching cable, from the terminating resistors of the filter. These terminated m-derived sections are used to present a better impedance match to the prototype sections than would be produced if the prototype sections were matched directly to their terminating resistance. Every filter has a characteristic delay time determined by the slope of the phase shift characteristic plotted against frequency over the pass band. In the instant case let us assume that the time delay per section be $T_0$ micro-seconds. If a pulse modulated carrier of the type shown in FIGURE 2 is applied to the input conductor 10, we have seen that the value of the capacity of the condenser 26 is such that while it readily by-passes the carrier frequency to ground, its time constant is such that in conjunction with the resistor 28 and the inductors 32 and 34 its time constant is much less than the rise time of the signal. The resistor 28 in series with the equivalent D.C. resistance of the filter and its terminations forms the cathode resistor of the cathode 22. The anode 76 is connected to a positive potential supply from terminal 78 through conductor 80, choke coil 82, primary winding 84 of an output transformer indicated generally by reference numeral 85, and through conductor 86. The output signal of the thermionic tube 20 appears across the primary winding 84 of the transformer 85 and is picked up by the secondary winding 86' and impressed across grid resistor 88 of a second thermionic tube 90. Any suitable coupling may be employed for passing the signal from one stage to the input of the succeeding stage of the amplifier, provided that it has the same time delay as one full section of the filter and that it has sufficient band width to pass the pulsed carrier without materially altering the shape of the pulse. The importance of the delay time of the interstage coupling as being equal to one full section of the low pass filter will be pointed out more fully hereafter.

In the drawing I have shown the amplifier as consisting of five stages, the thermionic tube 90 and its associated circuitry comprising the second stage, the thermionic tube 92 and its associated circuitry comprising the third stage, the thermionic tube 94 and its associated circuitry comprising the fourth stage, and the thermionic tube 96 and its associated circuitry comprising the fifth stage. The cathode 98 of the second stage, the cathode 100 of the third stage, the cathode 102 of the fourth stage and the cathode 104 of the fifth stage, are similar to the cathode 22 of the first stage. The resistor 99 of the second stage, the resistor 101 of the third stage, the resistor 103 of the fourth stage, and the resistor 105 of the fifth stage are similar to the resistor 28 of the first stage. Similarly the anode 97 of the second stage, the anode 99 of the third stage, the anode 101 of the fourth stage and the anode 103 of the fifth stage are similar to the anode 76 of the first stage. Each of the interstage couplings are similar to the coupling between the first and second stages.

The resistor 106 in the anode circuit of the final stage is such that the conditions on the plate 103 at the final stage will be the same as exists on the plates 101, 99, 97, and 76 of the preceding stages.

In any of the stages the grid will be at negative potential with respect to cathode because of the D.C. component of the plate current flowing through the cathode resistor in series with the equivalent D.C. resistance of the filter.

Figure 4:
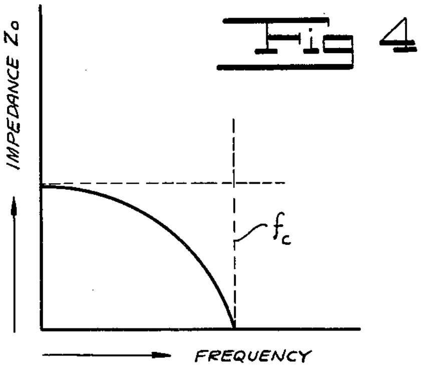
FIGURE 4 is a curve of frequency plotted against impedance of the filter using a mid-series termination.
Figure 5:
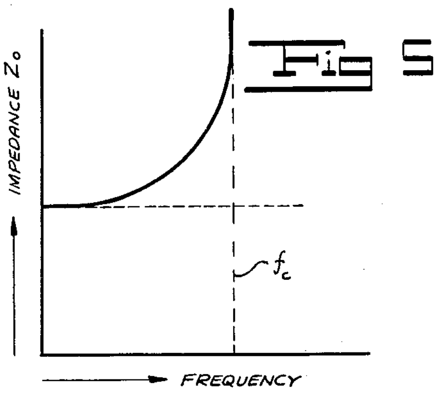
FIGURE 5 is a curve of frequency plotted against impedance using a mid-shunt termination.

While the signal applied to the control grid 18 of the input stage may have any desired amplitude, the function of my amplifier depends on this amplitude. Let us assume that the amplitude be very small, so small that the voltage developed upon the grid 107 of the output stage is small compared to the grid bias on that stage. Under these conditions no rectified output signal will appear across conductor 108 and ground, since there will be no change in the plate current of any stage, and hence no change in voltage across terminating resistors 72 or 74. Let us now suppose that the signal applied to the grid 18 is of such amplitude that the grid of one of the thermionic tubes, say tube 92, is driven positive during some part of the carrier cycle. Under these conditions during the positive peak of each cycle the grid of tube 92 will be driven positive with the result that the average plate current will increase during the duration of the pulse. This increase in plate current will produce a voltage pulse at the common junction of inductors 40 and 42 and resistor 101, since at this point the impedance will be one-half the characteristic impedance of the filter as seen at a mid-series point such as this junction. The impedance at such a point is shown in FIGURE 4 where $Z_0$ is the value of the terminating resistors 72 or 74. If this termination is made at a mid-shunt point, such as the common point between inductors 38 and 40 and capacitor 54, the impedance will be as shown in FIGURE 5. The pulse of voltage developed at the common point between inductors 40 and 42 and the resistor 101 travels along the filter in two directions, namely, forwardly toward the terminating resistor 74 and backwardly toward the terminating resistor 72. Besides creating the current pulse in resistor 101, the carrier voltage is amplified and appears as a signal at the grid of the thermionic tube 94. This signal will arrive at the grid of thermionic tube 94 $T_0$ micro-seconds later due to the delay in the interstage coupling network. The delay, however, in the filter section made up of inductors 42 and 44 and the capacitor 56 has the same delay time of $T_0$ micro-seconds. Accordingly, the carrier will arrive at the grid of thermionic tube 94 at the same time that the forward traveling pulse in the filter arrives at the common junction of inductors 44 and 46 and the resistor 103. Since the grid of thermionic tube 92 is already being driven positive by the signal and the stage consisting of this tube and following interstage coupling has a gain greater than unity, the grid of thermionic tube 94 will also be driven positive by the pulse carrier. This will produce an increase in the plate current and consequently a voltage pulse in the filter at the common junction of resistor 103 and the inductors 44 and 46, because the pulse which emanated from the cathode of thermionic tube 92 arrives at this point at the same instant two simultaneous actions occur. The first is that the grid of thermionic tube 94 becomes more negative with respect to its cathode since the cathode is becoming more positive with respect to ground, thus decreasing the gain of this stage and permitting the grid to accept larger signals. The second is that the rectified current flowing in the cathode circuit of thermionic tube 94 produces an additional voltage pulse in the filter in the same manner that the change in the plate current in thermionic tube 92 produced the original pulse. Since this pulse starts at the same time that the original pulse arrives, the two pulses are cumulated arithmetically.

It is this last effect which produces the logarithmic characteristic. As the radio frequency carrier passes through the thermionic tubes and their associated interstage coupling networks, the gain is the product of the individual gains while the signal appearing at the output of the filter is the sum of the individual gains.

The pulse traveling backwards to the terminating resistor 72 produces a variety of effects depending on the relative duration of the pulse and the delay time per stage. If the duration of the pulse is equal to or less than the delay time, the pulsed carrier will have completed its passage through the preceding stage before the backward traveling pulse will have reached the cathode of that stage, and hence will have no effect. If the pulse, however, is of longer duration than the filter delay time, then the D.C. pulse of voltage through the filter will reach the cathode of some earlier stage while the grid of that stage is under excitation by the carrier, and under these conditions if the carrier is sufficiently great in amplitude, it will be modulated by the pulse reaching the cathode. Since this pulse is positive with respect to ground, it will tend to reduce the amplitude of the incoming signal by increasing the relative negative bias upon the grid with respect to cathode, thereby acting as an instantaneous and automatic gain control without the necessity of the use of additional thermionic tubes. This effect, however, can be produced with stability only if the cathode resistors are connected to the filter at the mid-series point as shown in FIGURE 1, instead of at the mid-shunt point. If the cathode resistors are connected to the filter at the mid-shunt points, the resulting system will be unstable and will oscillate if the pulse duration is too long or if its amplitude is too high. The reason for this will be clear by reference to FIGURE 5, from which it will be seen that the impedance of the filter when the cathode resistors are connected to the mid-shunt points increases as a function of frequency. This result obtains since the filter is in series with the cathode resistor and the greater the frequency the greater will be the voltage developed across the filter, and hence the greater will be the voltage feedback to the cathode of an earlier stage, thus modulating the carrier. The thus modulated carrier will then in turn be amplified in passing through the amplification thermionic tube a second time. If the gain through the amplifier multiplied by the loss and the voltage divider action of the cathode resistor in series with the filter is greater than one, instability will result and the system will oscillate.

As will be seen by reference to FIGURE 4, when the cathode resistors are connected to the mid-series points in the filter network, the impedance will decrease as the frequency increases, giving the characteristic curve shown in FIGURE 4. The terminating resistors 72 and 74 prevent reflections from the ends of the filter.

Figure 6:
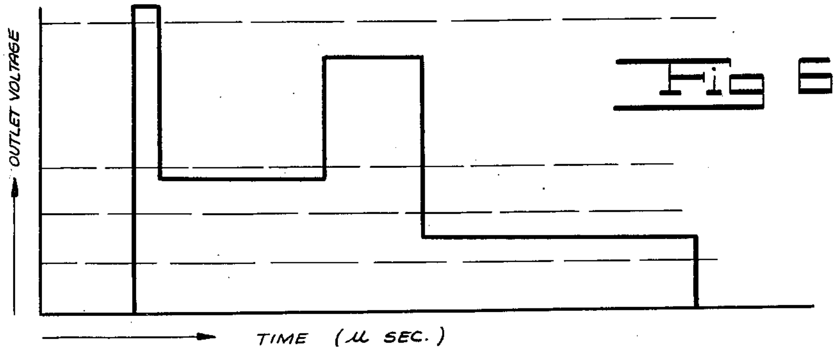
FIGURE 6 shows the envelope of a modulated carrier wave in which output voltage is plotted against time.

Referring now to FIGURE 6, I have shown a modulated carrier having an envelope comprising a pulse of random shape. Let us assume a signal such as shown in FIGURE 6 is applied to the amplifier between the input conductor 10 and ground. Let us assume that the radio frequency gain per stage be A, let B be the loss factor occurring during rectification to the filter, let V be the quiescent D.C. bias upon the grid. Let us assume there are $n$ stages, let $e$ represent the input voltage. The voltage appearing on the grid of the last stage, if this stage is the only one in which the grid is being driven positive, will be $eA^{n-1}$. The voltage appearing at output of the filter will be VB. The minimum input signal to produce this voltage will be $$e_1=\frac{V}{A^{n-1}}$$

If the last two stages are overloading, the voltage produced by the $n-2$ remaining stages will be $eA^{n-2}$. If the grid of this stage is just being driven positive, the input voltage required will be $$e_2=\frac{V}{A^{n-2}}$$

and the voltage produced in the output will be 2VB. In general, if the last $k$ stages are being driven positive, the voltage produced by the remaining $n-k$ stages will be $VA^{n-k}$, and the input required will be $$e_k=\frac{V}{A^{n-k}}$$

The output voltage will be $$kVB=E_k$$

The values of $E_k=kVB$ and $$e_k=\frac{V}{A^{n-k}}$$

representing the co-ordinates of those points on a curve of output plotted against input voltage of the amplifier at which the various stages successively limit for a large number of stages the curve will be found to approach a smooth curve which I will now show to be a logarithmic curve. The difference $\Delta e_k$ between sucessive points on the curve may be represented as follows:

$$\Delta e_k = e_k - e_{k-1} = \frac{V}{A^{n-k}} - \frac{V}{A^{n-k+1}} = \frac{V(A-1)}{A(A^{n-k})}$$

Then too, $$\Delta E_k = E_k - E_{k-1} = kVB - (k-1)VB = VB$$

Since we have shown that these points lie on a smooth curve, we can write $$\frac{\Delta e}{\Delta E} = \frac{(A-1)e}{AVB} = \frac{de}{dE}$$

Rewriting the above equation, we obtain $$\frac{de}{e} = dE.\frac{A-1}{AVB}$$

Solving this differential equation, we obtain $$\log e = \frac{A-1}{AVB}.E + K$$

Where K is a constant, rewriting this equation we obtain $$E = \frac{AVB}{A-1}.\log e + K$$

It will be readily apparent to those skilled in the art, therefore, that my amplifier produces a logarithmic output.

Figure 7:
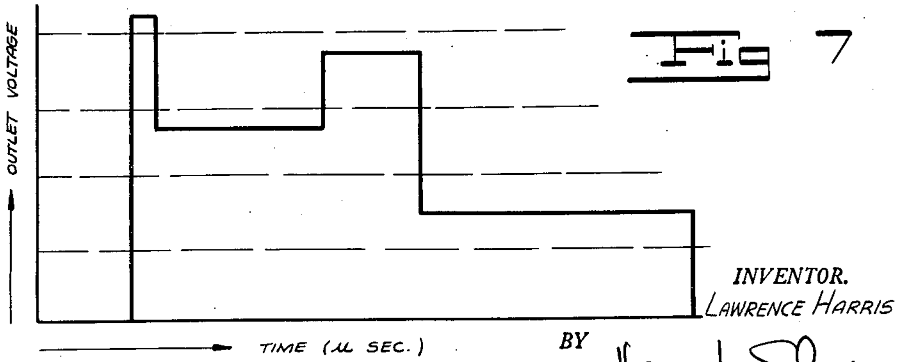
FIGURE 7 is a curve showing the envelope of the amplified modulated carrier wave comprising the output signal of my amplifier.

A curve showing the amplified output of my filter corresponding to the input signal shown in FIGURE 6, is shown in FIGURE 7. A comparison of these figures readily illustrates the compression of the peaks resulting from the logarithmic characteristics.

It will be seen that I have accomplished the objects of my invention.

I have provided a logarithmic output intermediate frequency amplifier having instantaneous automatic gain control without the necessity of using additional thermionic tubes. I have provided a logarithmic output intermediate frequency amplifier having an improved circuit which will not oscillate and which exhibits stable characteristics.

It will be understood that certain features and sub-combinations are of utility and may be employed without reference to other features and sub-combinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A logarithmic output amplifier including in combination a plurality of thermionic tubes each having a cathode, interstage coupling means coupling said thermionic tubes in cascade whereby the output signal of a thermionic tube is impressed as the input signal of the succeeding thermionic tube, a ladder filter comprising a corresponding plurality of filter sections connected in cascade with terminating half filter sections at each end of the filter, the cathodes of the thermionic tubes being connected to respective filter sections at mid-series points, said interstage coupling means having a delay time equal to the delay time of a corresponding full filter section.

2. A logarithmic output intermediate frequency amplifier as in claim 1, in which said means connecting the cathodes of the thermionic tubes to respective filter sections at mid-series points includes a resistor connected in series.

3. A logarithmic output intermediate frequency amplifier as in claim 1, in which said ladder filter comprises a low-pass filter including a plurality of T-sections.

4. A logarithmic output intermediate frequency amplifier as in claim 1, in which the ladder filter comprises a low-pass filter in which the series connected arms of the filter sections are inductors.

5. A logarithmic output intermediate frequency amplifier as in claim 1, in which the interstage coupling means comprise transformers having their primary windings in the anode circuits of preceding thermionic tubes and their secondary windings in the control grid circuits of succeeding thermionic tubes.

6. A logarithmic output intermediate frequency amplifier as in claim 1, in which the interstage coupling means comprise transformers having their primary windings in the anode circuits of preceding thermionic tubes and their secondary windings in the control grid circuits of succeeding thermionic tubes, and shunting resistors connected across the primary and secondary windings.

7. A logarithmic output amplifier including in combination a plurality of thermionic tubes each having a cathode, interstage coupling means coupling said thermionic tubes in cascade whereby the output signal of a thermionic tube is impressed as the input signal of the succeeding thermionic tube, a ladder filter comprising a corresponding plurality of filter sections connected in cascade with terminating half filter sections at each end of the filter, the cathodes of the thermionic tubes being connected to respective filter sections at points to give a characteristic impedance decreasing as a function of frequency, said interstage coupling means having delayed time equal to the delayed time of a corresponding full filter section.

References Cited in the file of this patent

UNITED STATES PATENTS

| | | |
|---|---|---|
| 2,263,376 | Blumlein | Nov. 18, 1941 |
| 2,313,098 | Shepard | Mar. 9, 1943 |